(12) United States Patent
Bunandar et al.

(10) Patent No.: US 12,417,329 B2
(45) Date of Patent: Sep. 16, 2025

(54) ARCHITECTING AN INTEGRATED CIRCUIT OR SYSTEM USING MACHINE LEARNING

(71) Applicant: Lightmatter, Inc., Boston, MA (US)

(72) Inventors: Darius Bunandar, Boston, MA (US); Nicholas C. Harris, Boston, MA (US)

(73) Assignee: Lightmatter, Inc., Boston, MA (US)

( * ) Notice: Subject to any disclaimer, the term of this patent is extended or adjusted under 35 U.S.C. 154(b) by 653 days.

(21) Appl. No.: 17/845,796

(22) Filed: Jun. 21, 2022

(65) Prior Publication Data

US 2022/0405450 A1 Dec. 22, 2022

Related U.S. Application Data

(60) Provisional application No. 63/213,573, filed on Jun. 22, 2021.

(51) Int. Cl.
*G06F 30/32* (2020.01)
*G06N 3/084* (2023.01)

(52) U.S. Cl.
CPC ............ *G06F 30/32* (2020.01); *G06N 3/084* (2013.01)

(58) Field of Classification Search
CPC ............................... G06F 30/32; G06N 3/084
USPC ......................................................... 716/101
See application file for complete search history.

(56) References Cited

U.S. PATENT DOCUMENTS

| | | | | |
|---|---|---|---|---|
| 9,792,397 | B1* | 10/2017 | Nagaraja | G06F 30/32 |
| 10,949,585 | B1* | 3/2021 | Winefeld | G06N 20/00 |
| 11,775,720 | B2* | 10/2023 | Mahmud | G06F 30/27 |
| | | | | 703/14 |
| 12,099,788 | B2* | 9/2024 | Salahuddin | G06N 20/00 |
| 2010/0049963 | A1* | 2/2010 | Bell, Jr. | G06F 15/7871 |
| | | | | 713/100 |
| 2019/0377847 | A1* | 12/2019 | Sha | G06F 18/214 |
| 2021/0097224 | A1* | 4/2021 | Lin | G06N 3/08 |
| 2022/0004900 | A1* | 1/2022 | Salahuddin | G06N 3/08 |
| 2025/0086522 | A1* | 3/2025 | Veefkind | G06N 3/045 |

OTHER PUBLICATIONS

Baddouh et al., Principal Kernel Analysis: A Tractable Methodology to Simulate Scaled GPU Workloads. Micro. Oct. 18-22, 2021. pp. 724-737.
Mirhoseini et al., Chip Placement with Deep Reinforcement Learning. arXiv:2004; Apr. 22, 2020;10746(1).15 pages.

* cited by examiner

*Primary Examiner* — Jack Chiang
*Assistant Examiner* — Suchin Parihar
(74) *Attorney, Agent, or Firm* — Wolf, Greenfield & Sacks, P.C.

(57) ABSTRACT

Systems and methods for designing a chip configured to perform computing processes are provided. The described techniques include obtaining information associated with the chip and determining, using a trained machine learning model and the information associated with the chip, selections of one or more circuit building blocks to be included in the chip. The chip architecture may then be generated to be used in fabrication of the chip based on the selections of the one or more circuit building blocks.

20 Claims, 8 Drawing Sheets

ARCHITECTING AN INTEGRATED CIRCUIT OR SYSTEM USING MACHINE LEARNING

RELATED APPLICATIONS

This Application claims priority under 35 § USC 119(e) to U.S. Provisional Patent Application Ser. No. 63/213,573, filed Jun. 22, 2021, entitled "ARCHITECTING AN INTEGRATED CIRCUIT OR SYSTEM USING MACHINE LEARNING," which is hereby incorporated herein by reference in its entirety.

BACKGROUND

Integrated circuits (ICs) include a number of circuit components integrally formed on one piece of material (e.g., semiconductor material). The circuit components may include a large number of transistors, analog electrical components (e.g., resistors, capacitors), and interconnections between these components integrated into the chip to form the IC. Because ICs can include many millions or even billions of circuit components, and because IC manufacturing is a complex semiconductor fabrication process subject to certain manufacturing constraints, IC design can be extremely challenging.

BRIEF SUMMARY

Some embodiments provide for a method for designing a chip configured to perform computing processes, the method comprising: obtaining information associated with the chip; determining, using a trained machine learning model and the information associated with the chip, selections of one or more circuit building blocks to be included in the chip; and generating a chip architecture to use in fabrication of the chip based on the selections.

Some embodiments provide for at least one non-transitory computer readable storage medium storing processor-executable instructions that, when executed by at least one processor, cause the at least one processor to perform a method for designing a chip configured to perform computing processes, the method comprising: obtaining information associated with the chip; determining, using a trained machine learning model and the information associated with the chip, selections of one or more circuit building blocks to be included in the chip; and generating a chip architecture to use in fabrication of the chip based on the selections.

Some embodiments provide for a system comprising: at least one processor configured to perform a method for designing a chip configured to perform computing processes, the method comprising: obtaining information associated with the chip; determining, using a trained machine learning model and the information associated with the chip, selections of one or more circuit building blocks to be included in the chip; and generating a chip architecture to use in fabrication of the chip based on the selections.

In some embodiments, obtaining the information associated with the chip comprises obtaining one or more of: representative workloads, representative datasets, circuit building blocks and parameters related to the circuit building blocks, target metrics, and/or a parameter constraint.

In some embodiments, the parameters related to the circuit building blocks comprise performance and/or cost information.

In some embodiments, the parameter constraint comprises at least one of power, performance, and/or area constraints.

In some embodiments, determining the selections of one or more circuit building blocks comprises determining selections of electronic circuit blocks and/or photonic circuit blocks.

In some embodiments, determining selections of the electronic circuit blocks and/or the photonic circuit blocks comprises determining selections of one or more of: a memory block, a microcontroller block, a microprocessor block, a photonic tensor multiplier block, a multiply and accumulate (MAC) block, a scheduler block, a control flow and/or logic block, and/or a networks on chip (NoCs) block.

In some embodiments, the techniques further provide for obtaining the trained machine learning model by training a machine learning model, the training comprising using unsupervised learning.

In some embodiments, using unsupervised learning comprises using reinforcement learning.

In some embodiments, using reinforcement learning comprises: obtaining an output from the machine learning model; calculating a reward using a reward function and the output, the reward function being a function of power, latency, area, and/or throughput of the chip; determining new parameter values of the machine learning model based on the calculated reward.

In some embodiments, the techniques further provide for obtaining the trained machine learning model by training a machine learning model, the training comprising using supervised learning based on a set of chip architectures.

In some embodiments, the techniques further provide for determining, using the trained machine learning model, a physical arrangement of the one or more circuit building blocks on the chip.

In some embodiments, the techniques further provide for obtaining the trained machine learning model by training a machine learning model using backpropagation, the backpropagation comprising using stochastic gradient-based optimizers.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

Described herein are techniques for generating chip architecture designs using a trained machine learning model. The trained machine learning model may be provided parameters and/or other information associated with the desired chip architecture and/or its desired usage as input. Based on this input, the trained machine learning model may determine selections of chip building blocks (e.g., memory blocks, processing blocks, etc.) to be included in the chip architecture design. From these selections, chip architecture designs may then be generated.

Designing the architecture of an integrated circuit or other chip-based computing system is a challenging task that is conventionally tackled manually by engineers with deep expertise of computer and systems architectures. This task is further complicated by the large design space (e.g., number and types of components, potential physical arrangements of components, etc.) that is available for any given chip architecture. The chip designer further takes into consideration the chip manufacturing process and the feasibility of a chip architecture given current fabrication technology as implemented by a foundry. Often, such chip architecture design decisions are made ad-hoc and without any mathematical proof that the selected architecture design is the optimal choice in terms of the chip's performance metrics or its ultimate usage goals.

Simulation tools have been developed to ease aspects of the challenges presented by chip architecture design. Such simulation tools can be used to evaluate the throughput, latency, or other performance metrics of a specified chip architecture. But these simulation tools cannot design a chip architecture, leaving the complicated task of designing the chip architecture, selecting its components, and arranging its layout to the chip designer.

The inventors have recognized and appreciated that the large design space for chip architectures can be well quantified using circuit, chip, and/or system simulation tools. For example, if the yield of a fabrication process only allows for a single full-reticle chip, then every component in the chip must be contained within a quantifiable area of the chip. As another example, circuit simulation tools can provide power, performance, and area trade-offs for circuit building blocks used in a chip architecture design. Additionally, the power and latency of memory read and write operations and data transfer within a chip architecture can be quantifiably estimated using a computer. Because these constraints and trade-offs of a chip and/or system design can be quantified, they can be provided to a computer to determine a pareto-optimal solution within the large design space for the chip and/or system architecture.

The inventors have further recognized and appreciated that quantifiable performance benchmarks of a prospective chip architecture may be used as feedback (e.g., as a "return" or cost function) to constrain the large chip architecture design space. When considering the end users or usages of a chip or computing system, the chip designer can define relevant benchmark metrics (e.g., performance, power, etc.) as well as relevant example workloads. For example, when designing a chip for running a natural-language processing neural network inference on an Internet-of-Things (IoT) device, a chip designer may consider the following constraints and metrics: (a) the power consumed by the chip may be supplied by a universal serial bus (USB) connection and may be limited to a few Watts, and (b) the latency of the inference pipeline may be desired to be under a second. Prospective chip architecture designs for this application may then have their power and latency metrics quantified and used to define the overall optimization landscape for the chip architecture design.

The inventors have accordingly developed systems and methods, described herein, to generate chip architecture designs using a trained machine learning model. In some embodiments, the techniques include obtaining information associated with the chip. The information associated with the chip includes one or more of: representative workloads of the chip, representative datasets to be handled by the chip, circuit building blocks and parameters related to the circuit building blocks, target metrics of the chip, and/or a parameter constraint of the chip. In some embodiments, the parameters related to the circuit building blocks comprise performance and/or cost information related to the chip, and in some embodiments, the parameter constraint comprises at least one of power, performance, and/or area (PPA) constraints.

In some embodiments, the information associated with the chip are provided as input to the trained machine learning model. The trained machine learning model then determines, using the input information associated with the chip, selections of circuit building blocks to be included in the chip architecture design. In some embodiments, the circuit blocks include electronic and/or photonic circuit blocks. For example, in some embodiments, the circuit blocks include one or more of a memory block, a microcontroller block, a microprocessor block, a photonic tensor multiplier block, a multiply and accumulate (MAC) block, a scheduler block, a control flow and/or logic block, and/or a networks on chip (NoCs) block.

In some embodiments, the techniques also include determining, using the trained machine learning model, a physical arrangement of the one or more circuit building blocks on the chip. By selecting both the circuit building blocks to be used in the chip architecture and determining the arrangement of the circuit building blocks, the trained machine learning model may generate a chip architecture design to be used in the fabrication of the chip.

In some embodiments, the techniques also include obtaining the trained machine learning model by training a machine learning model. Training the machine learning model may include using backpropagation techniques, unsupervised learning techniques, and/or supervised learning techniques. For example, training the machine learning model using backpropagation may include using stochastic gradient-based optimizers to implement the backpropagation.

As another example, training the machine learning model using unsupervised learning may include using reinforcement learning techniques. In some embodiments, using reinforcement learning includes obtaining an output from the machine learning model and calculating a reward using a reward function and the obtained output. The reward function may be a function of power, latency, area, throughput, and/or any other suitable parameter of the chip. The reward may then be used to determine new parameter values of the machine learning model.

In some embodiments, the techniques also include obtaining the trained machine learning model by training a machine learning model, the training comprising using supervised learning based on a set of chip architectures.

Following below are more detailed descriptions of various concepts related to, and embodiments of, using a trained machine learning model to generate chip architecture designs. It should be appreciated that various aspects described herein may be implemented in any of numerous ways. Examples of specific implementations are provided herein for illustrative purposes only. In addition, the various aspects described in the embodiments below may be used alone or in any combination and are not limited to the combinations explicitly described herein.

Figure 1A:
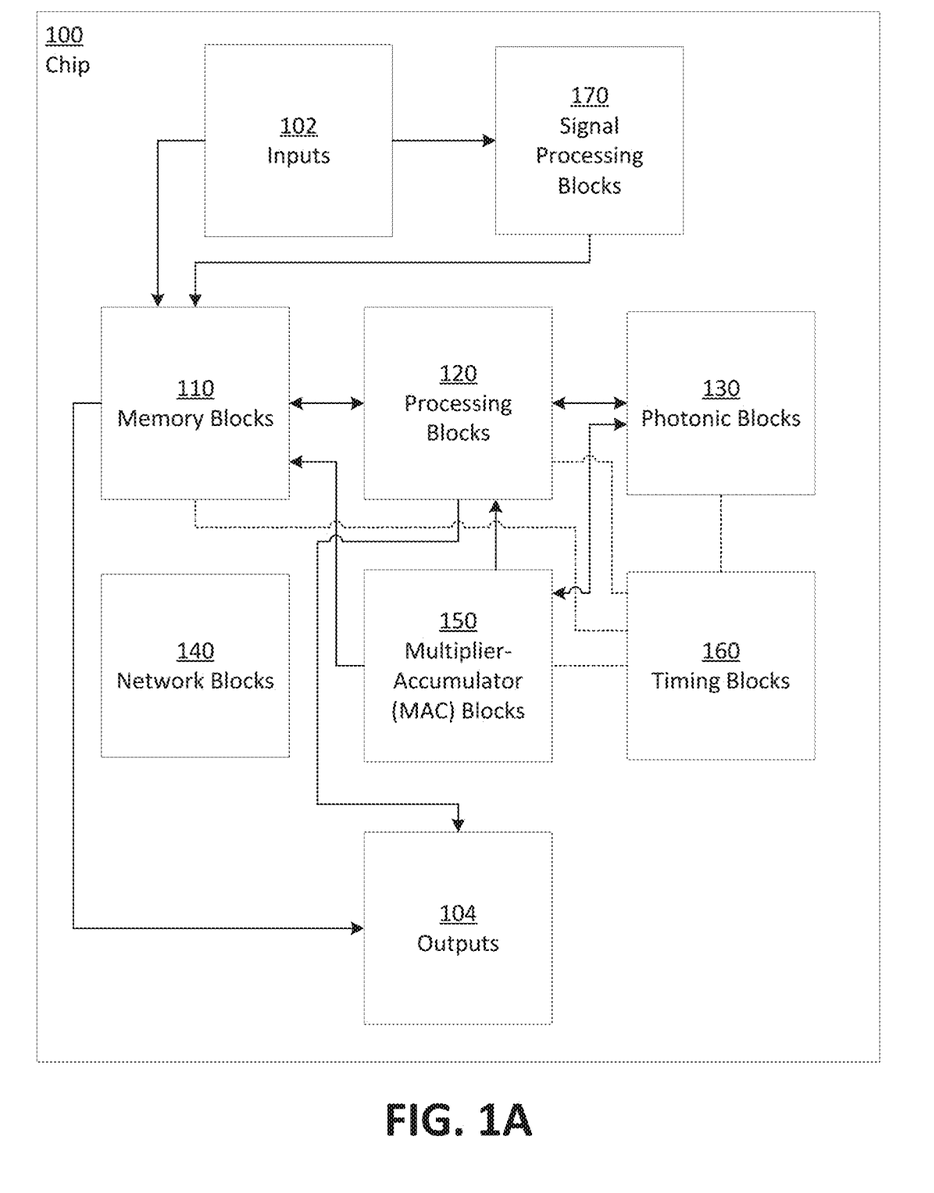
FIG. 1A is a schematic diagram of a chip 100 having a number of circuit blocks, in accordance with some embodiments described herein.
Figure 1B:
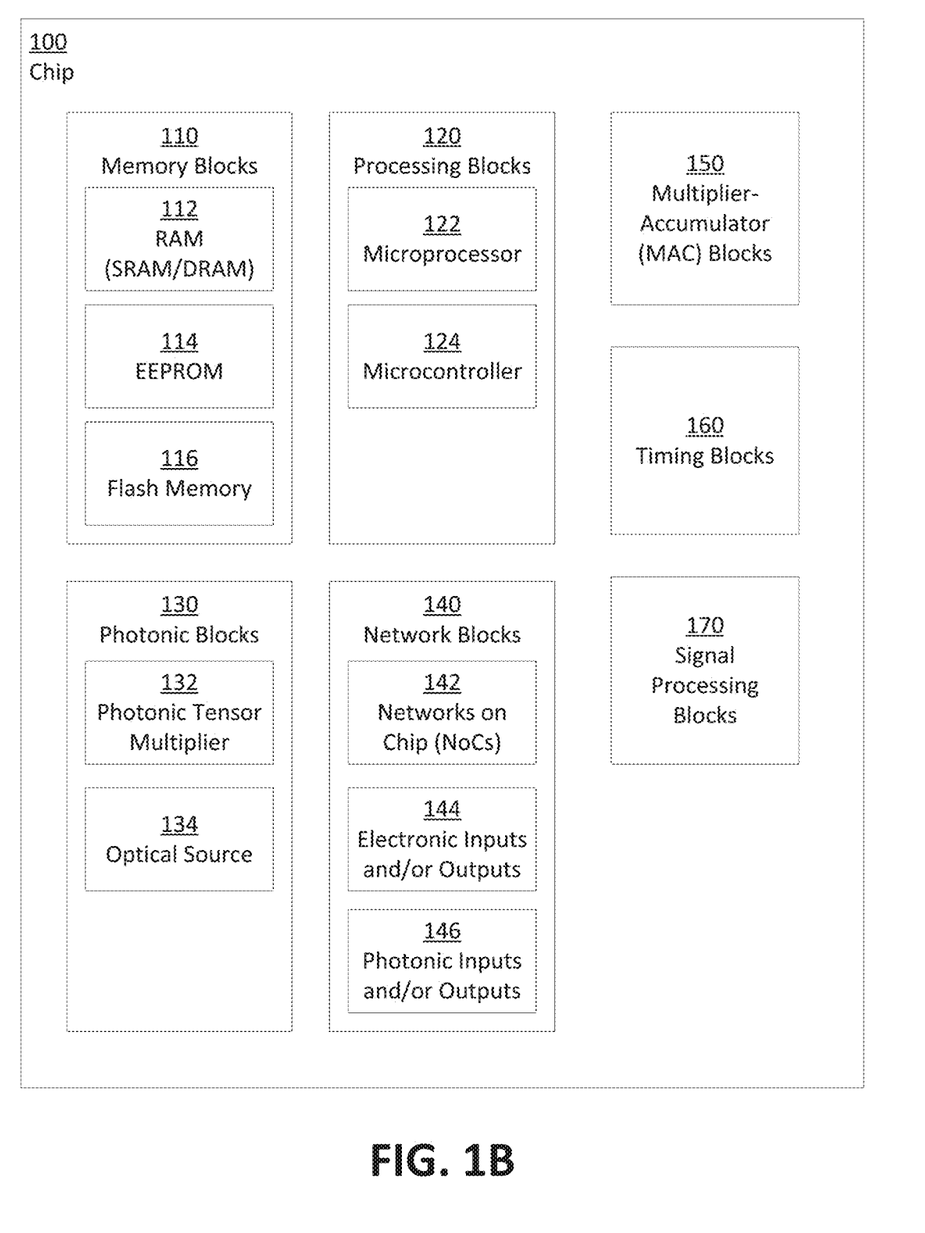
FIG. 1B is an alternative schematic diagram of the chip 100 having a number of circuit blocks, in accordance with some embodiments described herein.

FIG. 1A is a schematic diagram of a chip 100 having a number of circuit blocks, in accordance with some embodiments described herein. FIG. 1B is another schematic diagram of the chip 100 including examples of different types of circuit blocks that may be included in chip 100. The circuit building blocks in chip 100 act as templates or stencils for generating the chip architecture design.

It should be appreciated that chip 100 is a non-limiting example of the circuit blocks that may be included in a chip architecture design. In some embodiments, a chip architecture design may include only some of the circuit blocks illustrated in FIGS. 1A and 1B or may include additional or different circuit blocks that are not illustrated in FIGS. 1A and 1B, as aspects of the technology described herein are not limited in this respect. Additionally, the connections between circuit blocks illustrated in FIG. 1A are a non-limiting example of connections that may be included in a chip architecture design. In some embodiments, the chip architecture design may not include all of the connections shown in FIG. 1A and/or the chip architecture design may include alternative or additional connections than the connections shown in FIG. 1A, as aspects of the technology described herein are not limited in this respect.

In some embodiments, the chip 100 includes inputs 102 configured to receive input signals from one or more sources external to the chip 100. The inputs 102 may be configured to assist in the routing of signals from the one or more external sources to other circuit blocks (e.g., circuit blocks 110-170) within the chip 100. The chip 100 further includes outputs 104 configured to output signals from the chip 100 to one or more destinations external to the chip 100. In this manner, the chip 100 may receive information using inputs 102, perform processing on the received information using the circuit blocks 110-170, and thereafter output the processed information using outputs 104.

In some embodiments, the inputs 102 and the outputs 104 may be included in the network blocks 140. For example, the inputs 102 and the outputs 104 may be included as electronic inputs and/or outputs 144 and/or may be included as photonic inputs and/or outputs 146 of the network blocks 140. For example, in some embodiments, the inputs 102 and/or the outputs 104 may comprise conductive elements (e.g., conductive pins, conductive paste, conductive solder, etc.) configured to receive and/or output signals in the form of electrical signals. Alternatively or additionally, the inputs 102 and/or the outputs 104 may comprise photonic elements (e.g., optical fiber coupling elements, edge couplers, grating couplers, optical fiber-to-semiconductor converting elements, waveguides, etc.) configured to receive and/or output signals in the form of optical signals.

In some embodiments, the chip 100 includes memory blocks 110 configured to store information in either volatile or non-volatile computer memory. The memory blocks 110 may be configured to store information received from the inputs 102, as a result of processing performed by processing blocks 120, and/or as a result of multiplier-accumulation operations performed by multiplier-accumulator (MAC) blocks 150. The memory blocks 110 may further be configured to retrieve information from the components of the memory blocks 110 and transmit the retrieved information either to other circuit blocks (e.g., to processing blocks 120 and/or to photonic blocks 130) or to outputs 104 for output to an external device.

In some embodiments, the memory blocks 110 may include random-access memory (RAM) 112 including but not limited to static random-access memory (SRAM) and/or dynamic random-access memory (DRAM). The memory blocks 110 may alternatively or additionally include electrically erasable programmable read-only memory (EEPROM) 114 and/or flash memory 116. The memory blocks 110 may include any suitable combination of RAM 112, EEPROM 114, flash memory 116, and/or any additional computer-readable memory.

In some embodiments, the chip 100 includes processing blocks 120 configured to perform one or more arithmetic operations. For example, the processing blocks 120 may include a microprocessor 122 and/or a microcontroller 124 configured to execute program instructions and perform arithmetic operations. The microprocessor 122 may include, for example, a central processing unit (CPU), a graphics processing unit (GPU), a digital signal processor (DSP), a system on chip (SoC), or any other suitable processing device. The microcontroller 124 may include, for example, RISC-V based microcontrollers (e.g., ARM, SiFive) and/or FPGA microcontrollers.

In some embodiments, the processing blocks 120 may be configured to receive information retrieved from memory 110 and/or from processing performed by the photonic blocks 130 and to perform one or more arithmetic operations on the received information. The processing blocks 120 may be further configured to output the processed information to the memory blocks 110 for storage, to the photonic blocks 130 for further processing, and/or to outputs 104 for output to an external device.

In some embodiments, the chip 100 includes photonic blocks 130 configured to perform one or more photonic functions. For example, the photonic blocks 130 may include a photonic tensor multiplier 132 configured to perform matrix and/or tensor multiplication operations in the optical domain. Additional aspects of a photonic tensor multiplier 132 are described in U.S. Pat. No. 10,763,974 titled "Photonic Processing Systems and Methods," filed on May 14, 2019, which is incorporated herein by reference in its entirety.

In some embodiments, the photonic blocks 130 may additionally include an optical source 134 configured to supply one or more optical signals to other photonic circuit blocks (e.g., to the photonic tensor multiplier 132) of the photonic blocks 130. The optical source 134 may include, for example, one or more coherent and/or incoherent light sources configured to produce the one or more optical signals. The optical source 134, in some embodiments, may include a laser configured to emit light at a wavelength $\lambda_0$. The wavelength of emission may be in the visible, infrared (including near infrared, mid infrared and far infrared) or ultraviolet portion of the electromagnetic spectrum. In some embodiments, $\lambda_0$ may be in the O-band, C-band or L-band. In some embodiments, the optical source 134 may include multiple lasers configured to emit light at different wavelengths $\lambda_1, \lambda_2, \ldots, \lambda_n$.

In some embodiments, the chip 100 includes network blocks 140 configured to connect circuit blocks of the chip 100 to one another and to route signals between circuit blocks of the chip 100. For example, the network blocks 140 may include networks-on-chip (NoCs) 142. The NoCs 142 may be a network-based communications subsystem communicatively linking the various circuit blocks of the chip 100 to one another. Alternatively or additionally, the network blocks 140 may include databus systems, crossbar switch systems, and/or any other suitable photonic and/or electronic connections between the circuit blocks of the chip 100.

In some embodiments, the chip 100 includes multiplier-accumulator (MAC) blocks 150 configured to compute the product of two numbers and to write the computed product to the accumulators of the MAC blocks 150. The MAC blocks 150 may be configured to receive results generated and output by the photonic blocks 130 and to compute the product of two or more of the received outputs to determine an element of a matrix-matrix, matrix-tensor, and/or tensor-tensor multiplication operation. The MAC blocks 150 may be configured to output the computational results to the memory blocks 110 for storage or to processing blocks 120 and/or photonic blocks 130 for further processing.

In some embodiments, the chip 100 includes timing blocks 160 configured to provide one or more clock signals to the other circuit blocks of the chip 100. In some embodiments, the timing blocks 160 may include a crystal oscillator or other suitable component configured to generate a clock signal. In some embodiments, the timing blocks 160 may alternatively be configured to generate a spread-spectrum clock signal and/or a clock signal with dynamic frequency scaling. In some embodiments, the timing blocks 160 may alternatively or additionally include a scheduler block and/or a control flow and/or logic block.

In some embodiments, the timing blocks 160 may further be configured to provide a single phase clock signal, a two-phase clock signal, or a four-phase clock signal. In some embodiments, the timing blocks 160 may further include a clock multiplier configured to provide an increased clock signal frequency to one or more of the circuit blocks of the chip 100 (e.g., to the processing blocks 120).

In some embodiments, the chip 100 includes signal processing blocks 170 configured to modify one or more signals received at the inputs 102. For example, the signal processing blocks 170 may include a digital signal processing component (e.g., an analog-to-digital converter (ADC)) configured to convert an analog electrical signal into a digital electrical signal prior to routing the signal to the other, digital circuit blocks of the chip 100. Alternatively or additionally, the signal processing blocks 170 may include other suitable components (e.g., filtering components, compression components, Fourier transform components, etc.) to modify the one or more signals received at the inputs 102.

Figure 2:
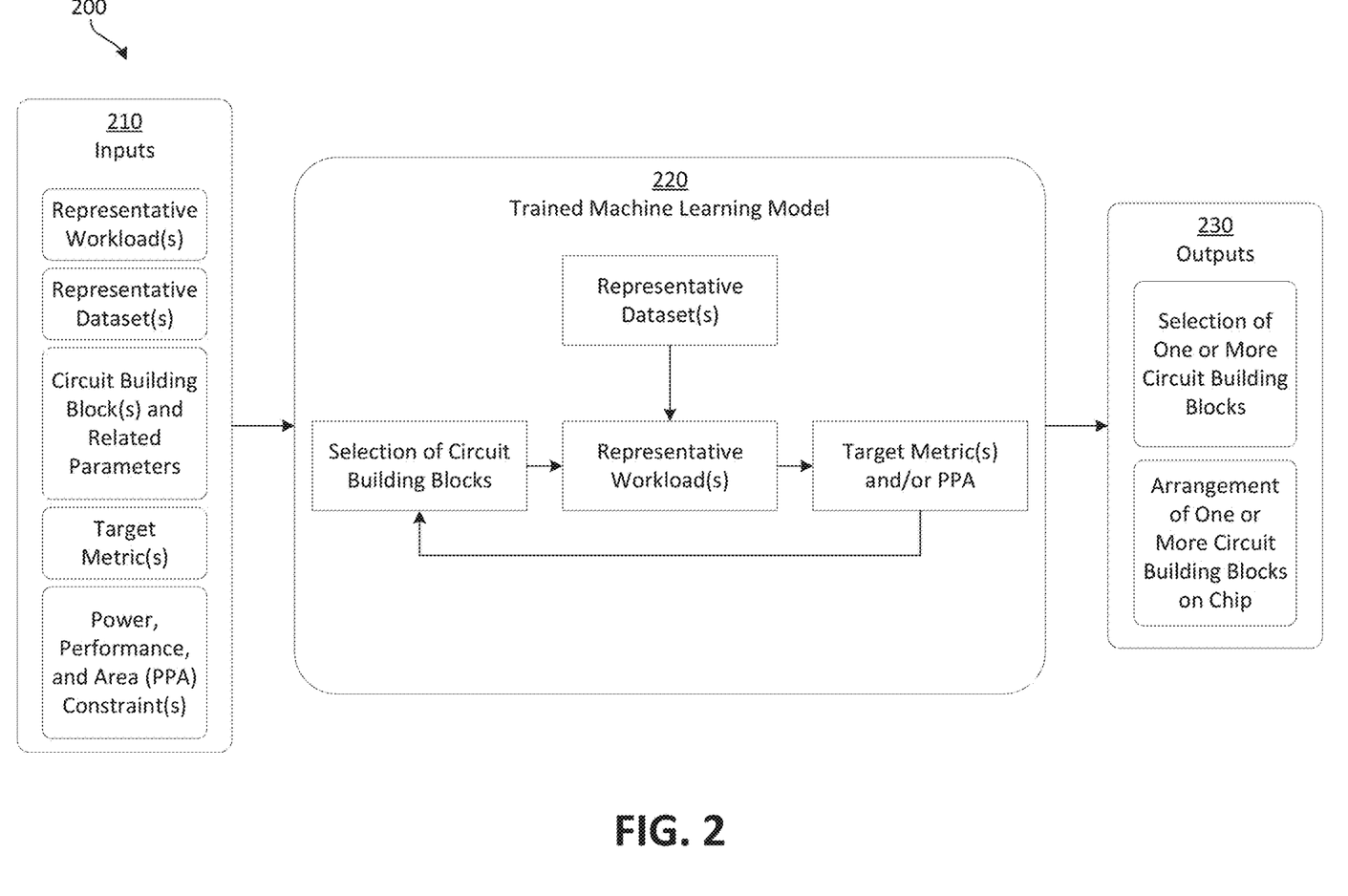
FIG. 2 is a diagram illustrating processing performed by a trained machine learning model to generate a chip architecture, in accordance with some embodiments described herein.

The inventors have recognized and appreciated that designing a chip like chip 100 by selecting the circuit blocks and their arrangement on the chip is a challenging design problem that may be eased by using a trained machine learning model. FIG. 2 is a diagram 200 illustrating the processing performed by a trained machine learning model 220 to generate a chip architecture design, in accordance with some embodiments described herein. The trained machine learning model 220 may be implemented using any suitable computing device, including computer system 600 described herein in connection with FIG. 6 and/or photonic processing system 700 described herein in connection with FIG. 7.

In some embodiments, one or more inputs 210 may be provided by a user to the trained machine learning model 220. The inputs 210 may specify information associated with the chip. For example, inputs 210 may include representative workloads of the chip. A representative workload may be illustrative software that the chip will be expected to run. In some embodiments, the inputs 210 may include representative datasets. A representative dataset may be illustrative data that the chip will be expected to process. As an example, if the chip being designed is intended to be a deep learning accelerator, the representative workloads may be representative neural networks (e.g., BERT, ResNet-50, and/or DLRM) intended to be implemented on the chip, and the representative datasets may be datasets typically used with each of the neural networks provided as representative workloads (e.g., SQuAD, ImageNet, and Criteo 1 TB click).

In some embodiments, the inputs 210 may include circuit building blocks and related parameters. The related parameters may include, in some embodiments, the performance of the circuit building blocks and the computing costs of the circuit building blocks. As an example, a circuit building block provided as an input 210 may be an SRAM block, and the related parameters may be the SRAM block's capacity, read and write times, and data transfer times. As another example, the circuit building block provided as an input 210 may be a microcontroller block, and the related parameters may be the types of microcontroller operations that are allowed and power and latency values for performing those operations. As another example, the circuit building block provided as an input 210 may be a photonic tensor multiplier, and the related parameters may be the power and latency used when performing a single matrix-matrix multiplication.

In some embodiments, the inputs 210 may include one or more target metrics for the application of the chip. The target metrics may include one or more performance metrics for the application of the chip. These performance metrics may include latency, throughput, response time, bandwidth, or any other suitable application-specific performance metrics.

In some embodiments, the inputs 210 may include power, performance, and/or area (PPA) constraints of the chip. For example, the available power that can be provided to the chip may be a constraint affecting the optimization of the chip architecture design. Alternatively or additionally, required performance metrics or available surface area of the chip may be provided as constraints affecting the optimization of the chip architecture design.

In some embodiments, the trained machine learning model 220 may be a machine learning model configured to perform chip architecture design. The trained machine learning model 220 may be one of a support vector machine (SVM), a Naive Bayes algorithm, a random forest algorithm, a boosting algorithm, a neural network model, a deep learning model, and/or any other suitable machine learning model architecture or algorithm.

In some embodiments, the trained machine learning model 220 may be configured to generate one or more chip architecture designs. The trained machine learning model 220 may first select an initial set of circuit building blocks (e.g., from the circuit building blocks provided as an input 210). Thereafter, a feedback loop applying the representative workloads and/or the representative datasets to the selected circuit building blocks may determine a cost/performance trade-off of the selected circuit building blocks.

In some embodiments, the cost-performance trade-offs of the circuit blocks may be differentiable or non-differentiable. Differentiable parameters may be well-parameterized metrics described by a set of real numbers, while non-differentiable parameters may be discrete metrics. As an example, a selected circuit block may be a systolic array of MAC units. The number of MAC units within the systolic array (e.g., 64×64, 128×128) is a discrete and non-differentiable parameter. However, the clock speed and power consumption of each MAC unit within the systolic array is a differentiable metric. As another example, a selected circuit block may be a wire, and the length of the wire and its power consumption (e.g., as estimated based upon the capacitance of the wire) may be a differentiable parameter.

In some embodiments, the target metric(s) provided as an input 210 may act as a proxy for the cost function of the trained machine learning model 220. For example, in some embodiments, the arithmetic average of the latency of the representative workloads may be defined as the cost function:

$$\frac{1}{N}\sum_{i=1}^{N} [\text{Latency of running workload}]_i [\text{Chip architecture, Dataset}_i]$$

where N is the number of different workloads provided as an input 210. In some embodiments, another target metric provided as an input 210 and used as a cost function may be based on the geometric average of the inverse throughput of the representative workloads:

$$\Pi_{i=1}^{N}(([\text{Throughput of running workload}]_i[\text{Chip architecture, Dataset}_i])^{-1})^{1/N}$$

In some embodiments, the target metric(s) and/or the PPA may be used as a cost function to learn the trained machine learning model 220 by providing feedback to the trained machine learning model 220. Based on this feedback, the trained machine learning model 220 may update its selection of circuit building blocks to better optimize the potential chip architecture design. This feedback loop may be repeated until the cost function of the trained machine learning model 220 reaches a local minimum.

In some embodiments, the trained machine learning model 220 may generate one or more outputs 230. The outputs 230 may include a selection of one or more circuit building blocks and associated arrangements of the selected one or more circuit building blocks. It should be appreciated that the outputs 230 may not be the best possible chip architecture designs (i.e., the global optima), but that the trained machine learning model 220 may generate multiple solutions to the optimization problem presented by the user through inputs 210.

In some embodiments, users may implement the trained machine learning model 220 using different seed inputs to obtain multiple chip architecture proposals that can be compared with another by the user. Additionally, in some embodiments, users may perform sensitivity analyses of the generated chip architecture designs to ensure that a specific architecture design is not sensitive to errors in fabrication.

In some embodiments, the trained machine model may be obtained by training a machine learning model. The inventors have recognized and appreciated that the trained machine model may be obtained using a variety of training strategies. For example, in some embodiments, the machine learning model may be trained using backpropagation. If the cost-performance trade-off is differentiable in nature, the backpropagation may be implemented using stochastic gradient descent or another suitable gradient-based optimizer including but not limited to AdaGrad, Adam, and/or AdamW. If the cost-performance trade-off is non-differentiable, then the backpropagation may be implemented by temporarily relaxing the requirement for a particular parameter to be discrete and/or an integer. For example, fractional values of the circuit elements may be permissible during training, and after training the machine learning model is complete, the specific parameter may be rounded, floored, and/or ceiled to produce a realizable chip architecture design.

Figure 3:
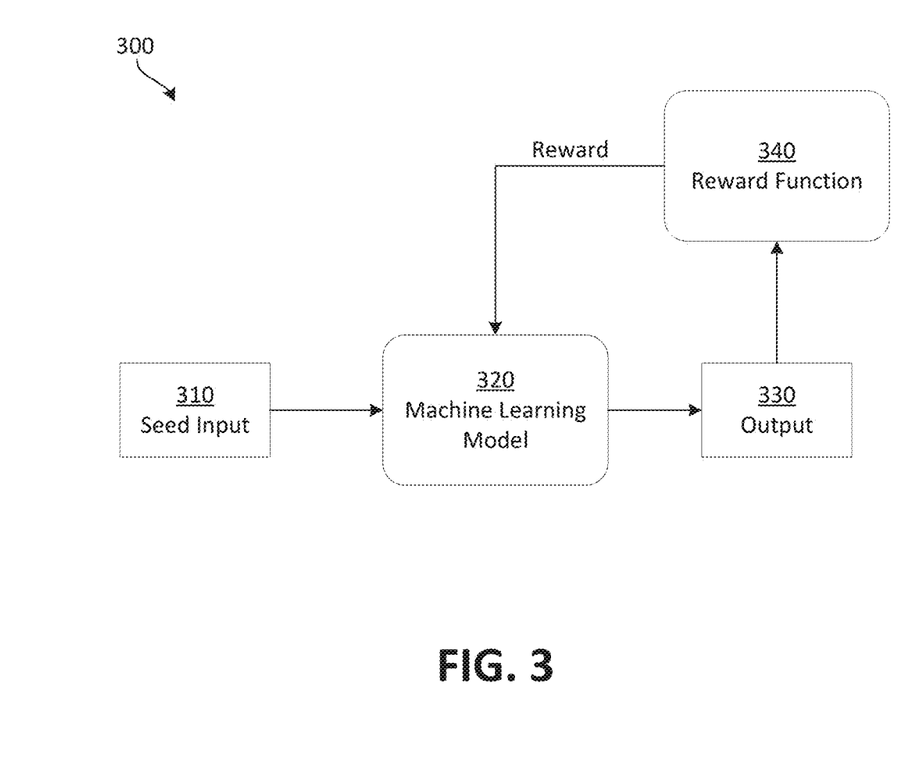
FIG. 3 is a diagram illustrating a process of training a machine learning model using unsupervised learning, in accordance with some embodiments described herein.

In some embodiments, the trained machine learning model may be obtained by training the machine learning model using unsupervised learning. An example of a process 300 for training the machine learning model using unsupervised learning is shown in the diagram of FIG. 3. Process 300 may be performed by any suitable computing device(s). For example, process 300 may be performed by one or more processors of a conventional computing system (e.g., as described in connection with FIG. 6) and/or may be performed by one or more processors of a photonic processing system (e.g., as described in connection with FIG. 7).

In some embodiments, unsupervised learning may be used to train the machine learning model because unsupervised learning does not require the generation of a training dataset. Instead, unsupervised learning may use reinforcement learning (RL) to train the machine learning model. To implement RL, a reward function 340 is used to analyze the output 330 of the machine learning model 320 based on a random seed input 310 provided to the machine learning model 320. The reward function 340 may be determined, for example, using a policy gradient method which is configured to estimate a gradient for differentiable and non-differentiable functions. The reward function 340 may generate a reward based on the output 330, and the reward may be provided to the machine learning model 320 as feedback. The parameters of the machine learning model 320 may be updated based on the reward, and this process may be repeated with the goal of maximizing the reward generated by the reward function 340. In some embodiments, the reward function is designed to be a function of the hardware power efficiency within the power and latency limits (e.g., as derived from hardware packaging constraints). The agent will be penalized if it derives a chip architecture design that violates these power and latency limits.

In some embodiments, and as an alternative, the unsupervised learning may be implemented using Q-learning. The machine learning model's states may be associated with the Q-learning concept of the agent's states, and the machine learning model's actions may be associated with the act of choosing a set of circuit blocks and/or circuit block arrangements.

Figure 4:
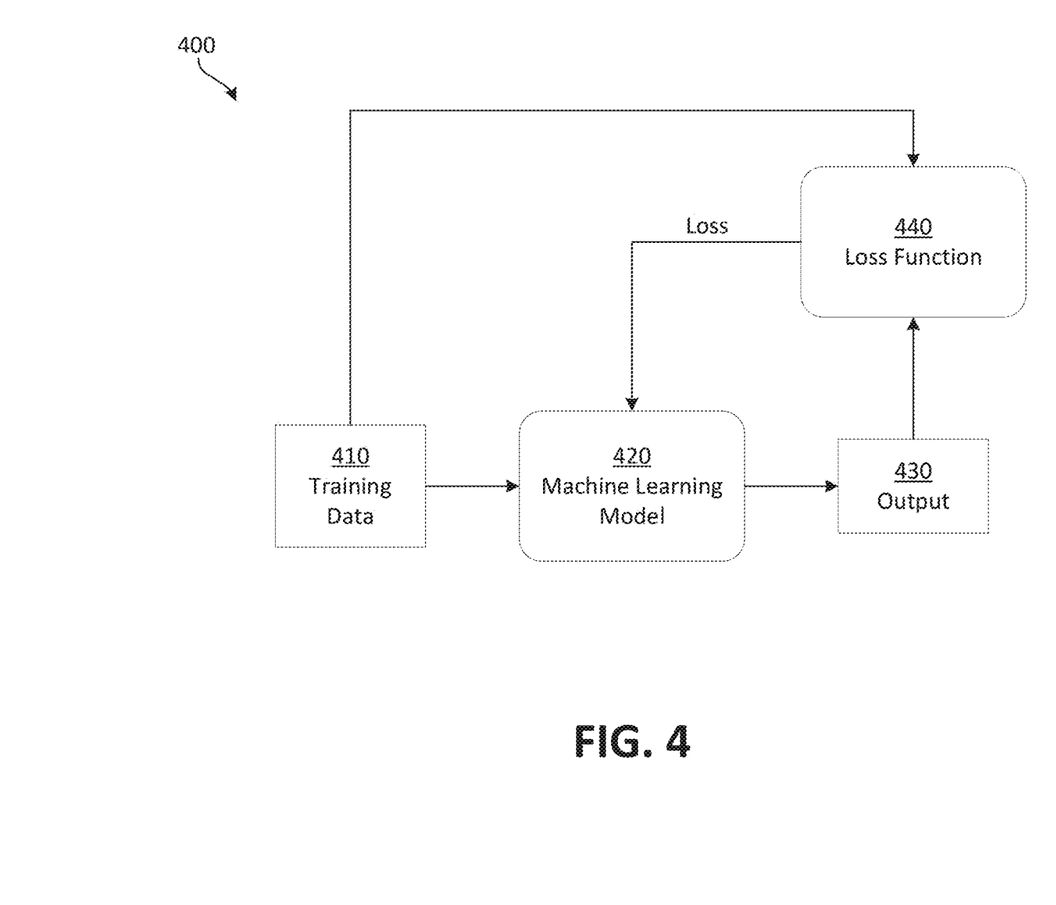
FIG. 4 is a diagram illustrating a process of training a machine learning model using supervised learning, in accordance with some embodiments described herein.

In some embodiments, the trained machine learning model may be obtained by training the machine learning model using supervised learning. An example of a process 400 for training the machine learning model using supervised learning is shown in the diagram of FIG. 4. In supervised learning, the machine learning model 420 may be trained using training data 410. The training data 410 may include pairs of data that include an input for use by the machine learning model 420 and a desired output (e.g., an optimized chip architecture design) for use by the loss function 440 in analyzing the output 430 of the machine learning model 420.

In some embodiments, one half of the data pairs of the training data 410 is provided to the machine learning model 420 as input. For example, sample input parameters (e.g., inputs 210) may be provided to the machine learning model 420 as input. The machine learning model 420 may then generate output 430 (e.g., a chip architecture design generated by the unlearned machine learning model). The output 430 may be analyzed by the loss function 440 by comparing the output 430 to the other half of the training data 410 (e.g., the chip architecture design corresponding to the input parameters). The loss function 440 may then generate a loss which is used to update the parameters of the machine learning model 420. By providing the machine learning model 420 with a number of training data inputs and updating the parameters of the machine learning model 420 after each training instance, the machine learning model 420 may be trained to generate chip architecture designs.

Figure 5:
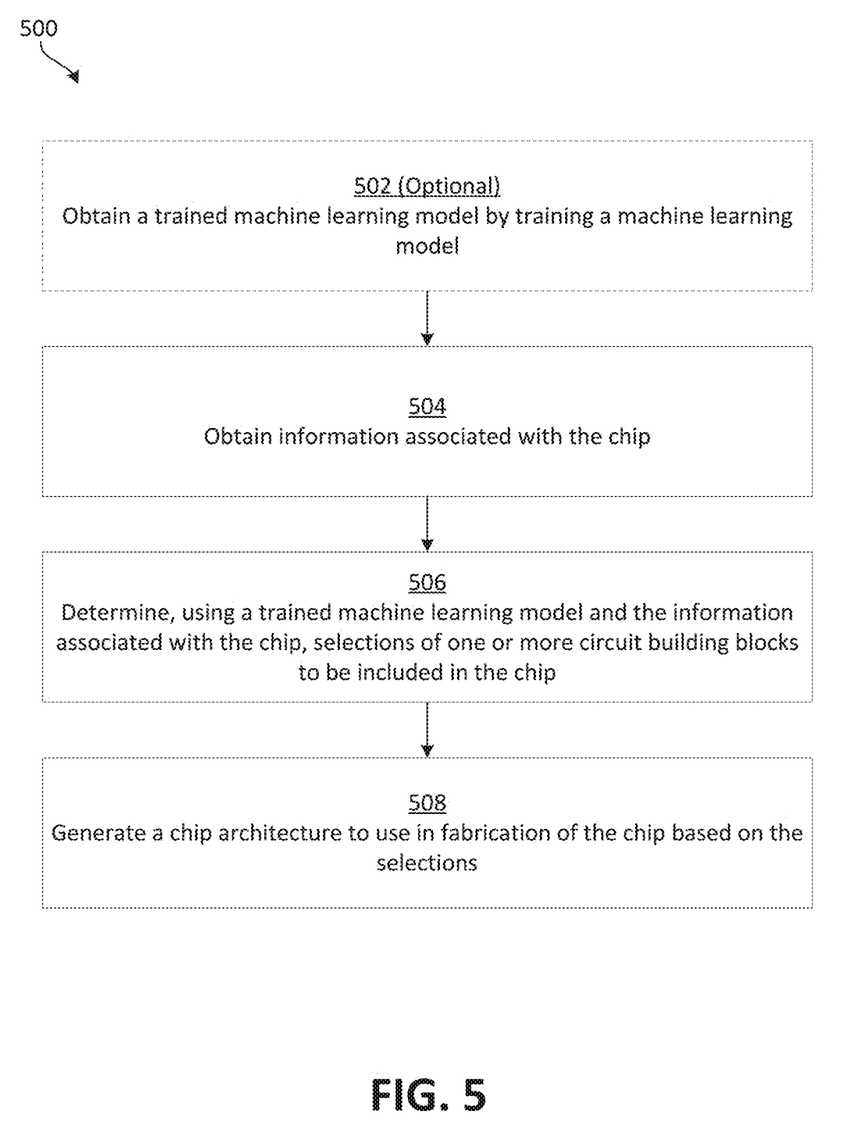
FIG. 5 is a flowchart of an illustrative process for generating a chip architecture using a trained machine learning model, in accordance with some embodiments described herein.

FIG. 5 is a flowchart of an illustrative process 500 for generating a chip architecture using a trained machine learning model, in accordance with some embodiments described herein. Process 500 may be performed by any suitable computing device(s). For example, process 500 may be performed by one or more processors of a conventional computing system (e.g., as described in connection with FIG. 6) and/or may be performed by one or more processors of a photonic processing system (e.g., as described in connection with FIG. 7).

In some embodiments, process 500 may optionally begin at act 502, where a trained machine learning model may be obtained by training a machine learning model. In some embodiments, the machine learning model may include one of a support vector machine (SVM), a Naive Bayes algorithm, a random forest algorithm, a boosting algorithm, a neural network model, a deep learning model, and/or any other suitable machine learning model architecture or algorithm.

In some embodiments, if the workload is a machine learning model, both the chip architecture design and the machine learning model may be trained at the same time. The machine learning model may have been previously trained, and the process of training for the chip architecture allows for tweaks on the previously trained machine learning model (i.e., either on the kernels within the machine learning model or on the weights/parameters of the machine learning model). The machine learning model can be tweaked to run with a lower latency or a higher power efficiency and/or throughput for the chosen chip architecture.

In some embodiments, training the machine learning model may include using backpropagation. In some embodiments, the backpropagation may be implemented using stochastic gradient-based optimizers to train the machine learning model. For example, the backpropagation may be implemented using stochastic gradient descent or another suitable gradient-based optimizer including but not limited to AdaGrad, Adam, and/or AdamW.

In some embodiments, training the machine learning model may include using unsupervised learning. For example, in some embodiments, the unsupervised learning may include reinforcement learning. In such embodiments, using reinforcement learning to train the machine learning model may include obtaining an output from the machine learning model and calculating a reward using a reward function and the output. The reward function may be a function of power, latency, area, throughput, and/or any other suitable metrics related to the chip. After calculating the reward, the reward may be used to determine new parameter values of the machine learning model. This process may be repeated using different seed inputs to train the machine learning model.

In some embodiments, training the machine learning model may include using supervised learning. For example, a training dataset may be provided to the machine learning model and used to train the machine learning model. The training dataset may include pairs of illustrative chip architectures and associated parameters describing the chip architectures.

In some embodiments, process 500 may next proceed to act 504, where information associated with the chip is obtained. The information associated with the chip may include one or more of representative workloads, representative datasets, circuit building blocks and parameters related to the circuit building blocks, target metrics, and/or a parameter constraint, as described herein. In some embodiments, the parameters related to the circuit building blocks include performance and/or cost information. In some embodiments, the parameter constraint includes at least one of power, performance, and/or area (PPA) constraints. In some embodiments, the PPA metrics can be obtained by synthesizing the chip using semiconductor EDA or CAD tools. The flow of the entire EDA/CAD tools, however, can be cumbersome and time-consuming. In this case, one strategy is to sample multiple points of design and obtain the PPA metrics. The table of points of design and PPA metrics can be used as representative metrics to be seen by the chip. This enables a faster way in finding a coarse solution to the problem. The full EDA/CAD toolflow is then only run when the optimizer is already close to the solution to refine the chip design and ensure its manufacturability.

In some embodiments, process 500 may next proceed to act 506, where selections of one or more circuit building blocks to be included in the chip may be determined. The selections may be determined using the trained machine learning model and the information associated with the chip. In some embodiments, the trained machine learning model may determine selections of electronic circuit blocks and/or photonic circuit blocks. For example, in some embodiments, the trained machine learning model may determine selections of one or more of: a memory block, a microcontroller block, a microprocessor block, a photonic tensor multiplier block, a multiply and accumulate (MAC) block, and/or a networks on chip (NoCs) block. In some embodiments, the trained machine learning model may further determine a physical arrangement of the selected one or more circuit building blocks on the chip.

In some embodiments, process 500 may next proceed to act 508, where a chip architecture to use in fabrication of the chip may be generated based on the selections of the one or more circuit building blocks. The chip architecture may be generated using the selections of the one or more circuit building blocks and the determined physical arrangement of the selected one or more circuit building blocks.

Figure 6:
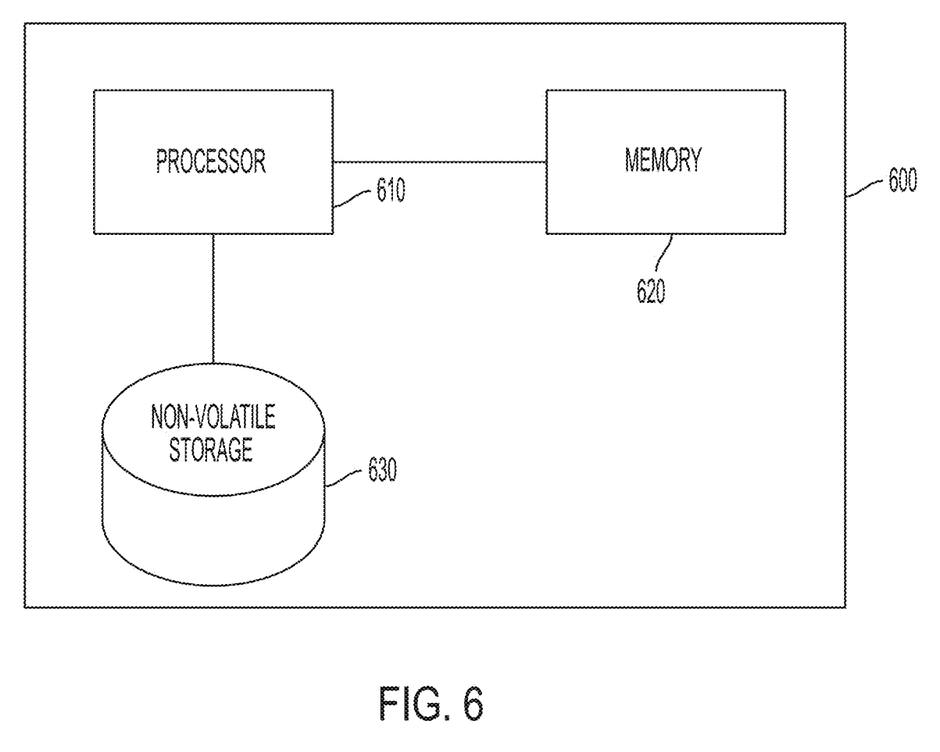
FIG. 6 is a diagram of an illustrative computer system, in accordance with some embodiments.

FIG. 6 is an illustrative implementation of a computer system 600 that may be used in connection with any of the embodiments of the disclosure provided herein. In some embodiments, any one of the processes described herein may be implemented on and/or using the computer system 600. The computer system 600 may include one or more processors 610 and one or more articles of manufacture that comprise non-transitory computer-readable storage media (e.g., memory 620 and one or more non-volatile storage media 630). The processor 610 may control writing data to and reading data from the memory 620 and the non-volatile storage device 630 in any suitable manner. To perform any of the functionality described herein, the processor 610 may execute one or more processor-executable instructions stored in one or more non-transitory computer-readable storage media (e.g., the memory 620), which may serve as non-transitory computer-readable storage media storing processor-executable instructions for execution by the processor 610.

Figure 7:
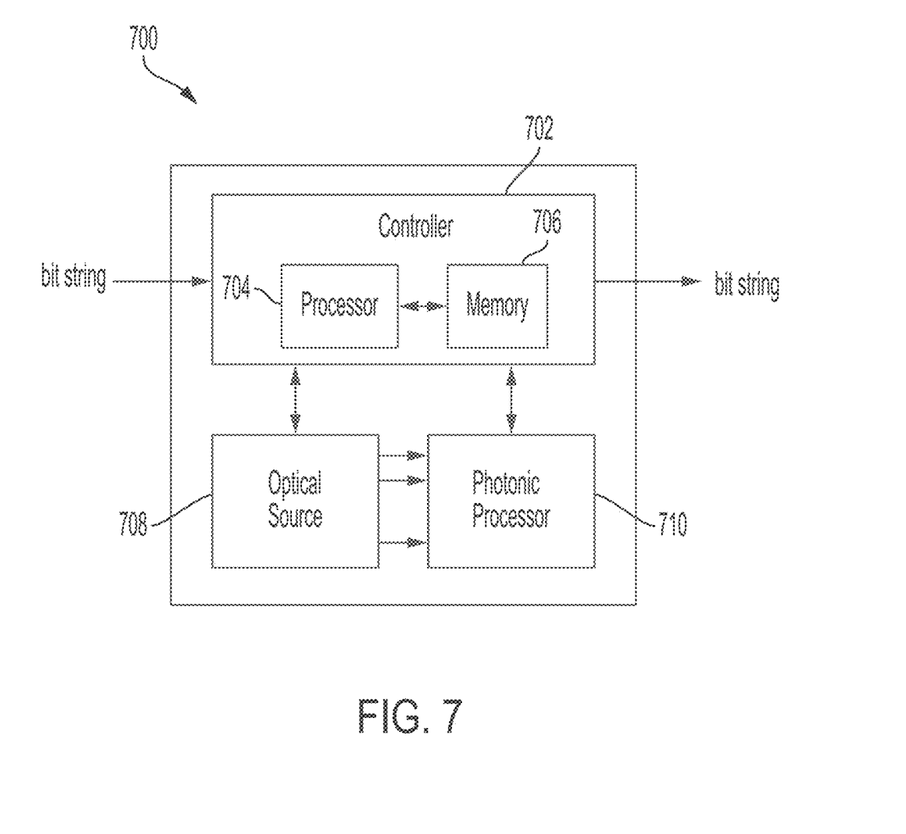
FIG. 7 is a diagram of an illustrative photonic computer system, in accordance with some embodiments.

FIG. 7 is a schematic diagram of a photonic processing system 700 implementing photonic processing techniques that may be used in connection with any of the embodiments of the disclosure provided herein, according to some embodiments of the technology described herein. Photonic processing system 700 includes a controller 702, an optical source 708, and a photonic processor 710. The photonic processing system 700 receives, as an input from an external processor (e.g., a CPU), an input vector and/or matrix represented by a group of input bit strings and produces an output vector and/or matrix represented by a group of output bit strings. The input bit string may be received as an electrical or optical signal from the external processor and the output bit string may be transmitted as an electrical or optical signal to the external processor.

In some embodiments, the controller 702 includes a processor 704 and a memory 706 for controlling the optical source 708 and/or photonic processor 710. The memory 706 may be used to store input and output bit strings and/or results from the photonic processor 710. The memory 706 may also store executable instructions that, when executed by the processor 704, control the optical source 708 and/or control components of the photonic processor 710 (e.g., encoders, phase shifters, and/or detectors). For example, the memory 706 may store executable instructions that cause the processor 704 to determine new input values to send to the photonic processor 710 based on the number of computational iterations that have occurred. Thus, the output matrix transmitted by the photonic processing system 700 to the external processor may be the result of multiple, accumulated multiplication operations, not simply a single multiplication operation. In another embodiment, the result of the computation by the photonic processing system 700 may be operated on digitally by the processor 704 before being stored in the memory 706. The operations on the bit strings may not be simply linear, but may also be non-linear or, more generally, be Turing complete.

The optical source 708 may be configured to provide the photonic processor 710 with optical signals, in accordance with some embodiments of the technology. Optical source 708 may include, for example, one or more coherent and/or incoherent light sources configured to produce the optical signals. Optical light source 708, in some embodiments, may include a laser configured to emit light at a wavelength $\lambda_0$. The wavelength of emission may be in the visible, infrared (including near infrared, mid infrared and far infrared) or ultraviolet portion of the electromagnetic spectrum. In some embodiments, $\lambda_0$ may be in the O-band, C-band or L-band. In some embodiments, optical light source 708 may include multiple lasers configured to emit light at different wavelengths $\lambda_1, \lambda_2, \ldots, \lambda_n$.

The photonic processor 710 may perform matrix-vector, matrix-matrix, and/or tensor-tensor multiplication operations, in accordance with some embodiments of the technology described herein. In some embodiments, the photonic processor 710 includes two parts: modulators configured to encode elements of the input vector, matrix, and/or tensor in the amplitude and/or intensity of the optical signals from optical source 708, and optical detectors configured to detect and convert optical signals to an electrical signal proportional to a product of the encoded elements. The photonic processor 710 outputs these electrical signals to the controller 702 for further processing and/or output to the external processor. Additional aspects of a photonic processor are described in U.S. Pat. No. 10,763,974 titled "Photonic Processing Systems and Methods," filed on May 14, 2019, which is incorporated herein by reference in its entirety.

Having thus described several aspects of at least one embodiment of this technology, it is to be appreciated that various alterations, modifications, and improvements will readily occur to those skilled in the art.

The above-described embodiments of the technology described herein can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component, including commercially available integrated circuit components known in the art by names such as CPU chips, GPU chips, microprocessor, microcontroller, or co-processor. Alternatively, a processor may be implemented in custom circuitry, such as an ASIC, or semi-custom circuitry resulting from configuring a programmable logic device. As yet a further alternative, a processor may be a portion of a larger circuit, photonic device, or semiconductor device, whether commercially available, semi-custom or custom. As a specific example, some commercially available microprocessors have multiple cores such that one or a subset of those cores may constitute a processor. Though, a processor may be implemented using circuitry in any suitable format.

Also, the various methods or processes outlined herein may be coded as software that is executable on one or more processors running any one of a variety of operating systems or platforms. Such software may be written using any of a number of suitable programming languages and/or programming tools, including scripting languages and/or scripting tools. In some instances, such software may be compiled as executable machine language code or intermediate code that is executed on a framework or virtual machine. Additionally, or alternatively, such software may be interpreted.

The techniques disclosed herein may be embodied as a non-transitory computer-readable medium (or multiple computer-readable media) (e.g., a computer memory, one or more floppy discs, compact discs, optical discs, magnetic tapes, flash memories, circuit configurations in Field Programmable Gate Arrays or other semiconductor devices, or other non-transitory, tangible computer storage medium) encoded with one or more programs that, when executed on one or more processors, perform methods that implement the various embodiments of the present disclosure described above. The computer-readable medium or media may be transportable, such that the program or programs stored thereon may be loaded onto one or more different computers or other processors to implement various aspects of the present disclosure as described above.

A computing device may additionally have one or more components and peripherals, including input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computing device may receive input information through speech recognition or in other audible format. As another example, a computing device may receive input from a camera, lidar, or other device that produces visual data.

Embodiments of a computing device may also include a photonic processor, such as the one described herein. The processor of the computing device may send and receive information to the photonic processor via one or more interfaces. The information that is sent and received may include settings of the detectors of the photonic processor and/or measurement results from the detectors of the photonic processor.

The terms "program" or "software" are used herein to refer to any type of computer code or set of computer-executable instructions that may be employed to program one or more processors to implement various aspects of the present disclosure as described above. Moreover, it should be appreciated that according to one aspect of this embodiment, one or more computer programs that, when executed, perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Program modules may include routines, programs, objects, components, data structures, etc. that perform particular tasks or implement particular abstract data types. Functionalities of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields to locations in a computer-readable medium that convey relationship between the fields. However, any suitable mechanism may be used to establish a relationship between information in fields of a data structure, including through the use of pointers, tags, or other mechanisms that establish relationship between data elements.

Various aspects of the technology described herein may be used alone, in combination, or in a variety of arrangements not specifically described in the embodiments described in the foregoing and is therefore not limited in its application to the details and arrangement of components set forth in the foregoing description or illustrated in the drawings. For example, aspects described in one embodiment may be combined in any manner with aspects described in other embodiments.

The technology described herein may be embodied as a method, examples of which are provided herein including with reference to FIG. 5. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B," when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, within ±2% of a target value in some embodiments. The terms "approximately" and "about" may include the target value.

What is claimed is:

1. A method for designing a chip configured to perform computing processes, the method comprising:
  obtaining information associated with the chip including representative workloads to be implemented on the chip and target metrics associated with the chip;
  determining, using a trained machine learning model and the information associated with the chip, selections of one or more circuit building blocks to be included in the chip by:
    obtaining an output based on evaluating at least one cost function indicative of the target metrics associated with the chip when the representative workloads are applied to a first selection of the one or more circuit building blocks; and
    updating the first selection of the one or more circuit building blocks to obtain a second selection of the one or more circuit building blocks based on the obtained output; and generating a chip architecture to use in fabrication of the chip based on the second selection of the one or more circuit building blocks.

2. The method of claim 1, wherein obtaining the information associated with the chip further comprises obtaining one or more of: representative datasets, circuit building blocks and parameters related to the circuit building blocks, and/or a parameter constraint.

3. The method of claim 2, wherein the parameters related to the circuit building blocks comprise performance and/or cost information.

4. The method of claim 2, wherein the parameter constraint comprises at least one of power, performance, and/or area constraints.

5. The method of claim 1, wherein determining the selections of one or more circuit building blocks comprises determining selections of electronic circuit blocks and/or photonic circuit blocks.

6. The method of claim 5, wherein determining selections of the electronic circuit blocks and/or the photonic circuit blocks comprises determining selections of one or more of: a memory block, a microcontroller block, a microprocessor block, a photonic tensor multiplier block, a multiply and accumulate (MAC) block, a scheduler block, a control flow and/or logic block, and/or a networks on chip (NoCs) block.

7. The method of claim 1, further comprising obtaining the trained machine learning model by training a machine learning model, the training comprising using unsupervised learning.

8. The method of claim 7, wherein using unsupervised learning comprises using reinforcement learning.

9. The method of claim 8, wherein using reinforcement learning comprises:
obtaining an output from the machine learning model;
calculating a reward using a reward function and the output, the reward function being a function of power, latency, area, and/or throughput of the chip; and
determining new parameter values of the machine learning model based on the calculated reward.

10. The method of claim 1, further comprising obtaining the trained machine learning model by training a machine learning model, the training comprising using supervised learning based on a set of chip architectures.

11. The method of claim 1, further comprising determining, using the trained machine learning model, a physical arrangement of the one or more circuit building blocks on the chip.

12. The method of claim 1, further comprising obtaining the trained machine learning model by training a machine learning model using backpropagation, the backpropagation comprising using stochastic gradient-based optimizers.

13. At least one non-transitory computer readable storage medium storing processor-executable instructions that, when executed by at least one processor, cause the at least one processor to perform a method for designing a chip configured to perform computing processes, the method comprising:
obtaining information associated with the chip including representative workloads to be implemented on the chip and target metrics associated with the chip;
determining, using a trained machine learning model and the information associated with the chip, selections of one or more circuit building blocks to be included in the chip by:
obtaining an output based on evaluating at least one cost function indicative of the target metrics associated with the chip when the representative workloads are applied to a first selection of the one or more circuit building blocks; and
updating the first selection of the one or more circuit building blocks to obtain a second selection of the one or more circuit building blocks based on the obtained output; and
generating a chip architecture to use in fabrication of the chip based on the second selection of the one or more circuit building blocks.

14. The at least one non-transitory computer readable storage medium of claim 13, wherein obtaining the information associated with the chip further comprises obtaining one or more of: representative datasets, circuit building blocks and parameters related to the circuit building blocks, and/or a parameter constraint.

15. The at least one non-transitory computer readable storage medium of claim 13, wherein determining the selections of one or more circuit building blocks comprises determining selections of electronic circuit blocks and/or photonic circuit blocks.

16. The at least one non-transitory computer readable storage medium of claim 15, wherein determining selections of the electronic circuit blocks and/or the photonic circuit blocks comprises determining selections of one or more of: a memory block, a microcontroller block, a microprocessor block, a photonic tensor multiplier block, a multiply and accumulate (MAC) block, a scheduler block, a control flow and/or logic block, and/or a networks on chip (NoCs) block.

17. The at least one non-transitory computer readable storage medium of claim 13, further comprising obtaining the trained machine learning model by training a machine learning model, the training comprising using unsupervised learning.

18. The at least one non-transitory computer readable storage medium of claim 13, further comprising determining, using the trained machine learning model, a physical arrangement of the one or more circuit building blocks on the chip.

19. The at least one non-transitory computer readable storage medium of claim 13, further comprising obtaining the trained machine learning model by training a machine learning model using backpropagation, the backpropagation comprising using stochastic gradient-based optimizers.

20. A system comprising:
at least one processor configured to perform a method for designing a chip configured to perform computing processes, the method comprising:
obtaining information associated with the chip including representative workloads to be implemented on the chip and target metrics associated with the chip;
determining, using a trained machine learning model and the information associated with the chip, selections of one or more circuit building blocks to be included in the chip by:
obtaining an output based on evaluating at least one cost function indicative of the target metrics associated with the chip when the representative workloads are applied to a first selection of the one or more circuit building blocks; and
updating the first selection of the one or more circuit building blocks to obtain a second selection of the one or more building blocks based on the obtained output; and
generating a chip architecture to use in fabrication of the chip based on the second selection of the one or more circuit building blocks.

* * * * *